(12) United States Patent
Hirasawa et al.

(10) Patent No.: US 8,149,082 B2
(45) Date of Patent: Apr. 3, 2012

(54) RESISTOR DEVICE

(75) Inventors: Koichi Hirasawa, Nagano (JP); Hitoshi Amemiya, Nagano (JP); Atsunori Hayashi, Nagano (JP)

(73) Assignee: Koa Corporation, Ina-shi (JP)

( * ) Notice: Subject to any disclaimer, the term of this patent is extended or adjusted under 35 U.S.C. 154(b) by 279 days.

(21) Appl. No.: 12/666,704

(22) PCT Filed: Jun. 26, 2008

(86) PCT No.: PCT/JP2008/062029
§ 371 (c)(1),
(2), (4) Date: Dec. 24, 2009

(87) PCT Pub. No.: WO2009/005108
PCT Pub. Date: Jan. 8, 2009

(65) Prior Publication Data
US 2010/0328021 A1    Dec. 30, 2010

(30) Foreign Application Priority Data
Jun. 29, 2007    (JP) .................................. 2007-171871

(51) Int. Cl.
*H01C 1/02*    (2006.01)
(52) U.S. Cl. .......... 338/226; 338/248; 338/252; 29/611; 257/774; 257/712
(58) Field of Classification Search .................. 338/226, 338/237, 245–246, 248, 250, 252, 277; 29/610.1, 29/611, 613; 257/532, 528, 712, 728, 774
See application file for complete search history.

(56) References Cited

U.S. PATENT DOCUMENTS

| | | | |
|---|---|---|---|
| 6,208,020 B1 * | 3/2001 | Minamio et al. | 257/684 |
| 6,568,068 B1 * | 5/2003 | Golan et al. | 29/612 |
| 6,836,022 B2 * | 12/2004 | Boone et al. | 257/778 |
| 6,906,259 B2 * | 6/2005 | Hayashi | 174/520 |
| 7,148,554 B2 | 12/2006 | Nah et al. | |
| 7,429,791 B2 * | 9/2008 | Kurihara et al. | 257/712 |

FOREIGN PATENT DOCUMENTS

JP    61-199650 A    9/1986

(Continued)

OTHER PUBLICATIONS

International Search Report of PCT/JP2008/062029, mailing date of Oct. 7, 2008.

*Primary Examiner* — Kyung Lee

(57) ABSTRACT

The resistor device is provided with a resistive plate (11) of metal plate material, which is used as a resistance body; a radiative plate (15) of metal plate material, which is spaced from the resistive plate and intercrossed on the resistive plate; a molded resin body (19), which encloses an intercrossing portion of the resistive plate and the radiative plate; terminal portions of the resistive plate (11a), which comprises so that both ends of the resistive plate extending from the molded resin body are bent along an end face and a bottom face of the molded resin body; and terminal portions of the radiative plate (15a), which comprises so that both ends of the radiative plate extending from the molded resin body are bent along an end face and a bottom face of the molded resin body. Accordingly, the surface-mountable resin-sealed metal plate resistor device is enabled to increase the power capacity drastically and to improve the reliability without changing most of the size.

13 Claims, 9 Drawing Sheets

FOREIGN PATENT DOCUMENTS

| | | |
|---|---|---|
| JP | 2-118901 U | 9/1990 |
| JP | 2-309602 A | 12/1990 |
| JP | 3-238852 A | 10/1991 |
| JP | 4-005601 U | 1/1992 |
| JP | 4-123502 U | 11/1992 |
| JP | 5-217713 A | 8/1993 |
| JP | 5-82002 U | 11/1993 |
| JP | 6-275403 A | 9/1994 |
| JP | 8-181001 A | 7/1996 |
| JP | 11-251101 A | 9/1999 |
| JP | 11-251103 A | 9/1999 |
| JP | 2001-244666 A | 9/2001 |
| JP | 2002-290090 A | 10/2002 |
| JP | 2006-245478 A | 9/2006 |

\* cited by examiner

Prior Art : Simulation Result

Present Invention : Simulation Result

RESISTOR DEVICE

TECHNICAL FIELD

The present invention relates to a surface-mountable resin-sealed resistor device, especially relating to a mounting structure for its heat dissipation.

BACKGROUND ART

Heretofore, upon an electronic part, which is surface-mountable on a printed circuit board etc., kinds of heat dissipation structures have been proposed by U.S. Pat. No. 7,148,554, and Japanese laid open patent publications 2-309602, 8-181001, 5-217713, and 11-251103 etc.

By U.S. Pat. No. 7,148,554 and Japanese laid open patent publication 2-309602, it is proposed that forming an electrode for heat dissipation at central portion on bottom face of a ceramics substrate of rectangular chip resistor etc. to be spaced from resistor's electrodes, fixing heat dissipating electrode to a conductor pattern for cooling formed on a mounting board such as printed circuit board etc., and dissipating the heats. However, since the heat dissipating electrode is disposed at bottom face of the ceramics substrate, heat dissipating route is limited to one direction from heat generating resistance body to heat dissipating electrode at bottom face, and it seems that there is a problem in efficiency of heat dissipation not being good.

Also, by Japanese laid open patent publications 8-181001 and 5-217713, it is proposed that a resistance body (resistive film) is buried in a resistor supporting body of ceramics material etc. in the shape of a sandwich for improving heat dissipation characteristics. However, it seems that manufacturing process becomes complicated. Also, by Japanese laid open patent publication 11-251103, it is proposed that a resistance body is disposed in a case of insulative material and sealed by cement-like insulative material for improving heat dissipation characteristics.

Further, as to prior art technologies in this technical field, Japanese laid open patent publications 06-275403, 11-251101, 2002-290090, Japanese utility model application 3-028970 (laid open publication 04-123502) micro-film, Japanese laid open patent publications 03-238852, 61-199650, and Japanese utility model application 01-028084 (laid open publication 02-118901) micro-film etc. are known.

DISCLOSURE OF INVENTION

In the field of surface-mountable resin-sealed resistor devices, it is not exceptional, but while keeping resistor devices at whole small and compact, to improve heat dissipation characteristics and to make power capacity larger is requested. Also, generally, thermal expansion coefficients between the resistor devices and the printed circuit boards for mounting are greatly different. There are cases that form cracks in fixing portions of the resistor devices by soldering and that lose stabilities of resistance values, thus an improvement of fixation characteristics of the resistor devices to the mounting boards such as printed circuit boards etc. is expected.

The present invention has been made in view of the above problems. An object of the present invention is to provide an improved resistor device for heat dissipation, which enables to improve power capacity larger, and to improve fixation to mounting boards such as printed circuit boards stronger, while keeping the surface-mountable resin-seal resistor device structure at whole small and compact.

The resistor device of the present invention comprises, a resistive plate of metal plate material, which is used as a resistance body; a radiative plate of metal plate material, which is spaced from the resistive plate and intercrossed on the resistive plate; a molded resin body, which encloses an intercrossing portion of the resistive plate and the radiative plate; terminal portions of the resistive plate, which comprises so that both ends of the resistive plate extending from the molded resin body are bent along an end face and a bottom face of the molded resin body; and terminal portions of the radiative plate, which comprises so that both ends of the radiative plate extending from the molded resin body are bent along an end face and a bottom face of the molded resin body.

According to the present invention, the heat generated at the resistive plate of metal plate material, especially at its upper side, can be efficiently absorbed by the radiative plate of metal plate material spaced from the resistive plate and intercrossed on the resistive plate. Further, the heat can conduct through the terminal portions of the radiative plate, which is disposed to be bent along end face and bottom face of the molded resin body, to a cooling body, which is provided on a mounting board. Further, by fixing portion of the radiative plate, which is disposed on central portion of the resistor device at bottom face of the molded resin body, to a cooling pad on mounting board by soldering, the central portion of the resistor device can be strongly fixed to the mounting board.

As a result, temperature rises of the resistance body and the resistor device can be decreased, power capacity of the resistor device can be increased, resistance value variation basing on TCR of the resistance body at power on state can be decreased since temperature rise by self heat generation becomes small, and fixation of the resistor device to the mounting board can be improved since the central portion of the resistor device is fixed to the mounting board. Therefore, the surface-mountable resin-sealed metal plate resistor device is enabled to increase the power capacity drastically and to improve the reliability without changing most of the size.

BEST MODE FOR CARRYING OUT THE INVENTION

Figure 1A:
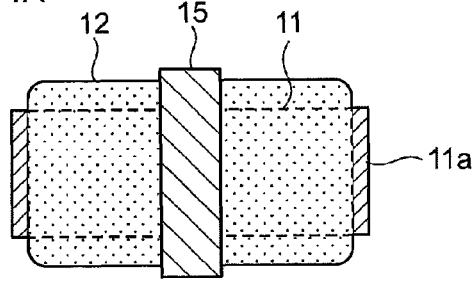
FIG. 1A is a top view of the resistor device according to an embodiment of the present invention.

Embodiments of the present invention will be described in detail below with referring to the drawings. Like or corresponding parts or elements will be denoted by the same reference characters throughout views.

FIGS. 1A-1D show a resistor device according to first embodiment of the present invention. The resistor device is a metal plate resistor device for current detection, in which a portion of resistive plate 11 of metal plate material such as Cu—Ni alloy etc. used as a resistance body is sealed by resin. The portion of resistive plate 11 enclosed by molded resin body 12 works substantially as the resistance body, and another portions of resistive plate 11 extending from the molded resin body 12 become terminal portions 11a. Both terminal portions 11a are bent along longitudinal end face and bottom face of the molded resin body 12. The terminal portion 11a of resistive plate 11 is provided with solder layer 14 at bottom face of the molded resin body 12. The solder layer 14 makes solder bondability to printed circuit board etc. good.

The radiative plate 15, which comprises metal plate material of good thermal conductivity such as Cu film or Cu plate etc., is disposed on outer faces of the molded resin body 12 at longitudinal central portion to surround the molded resin body 12 along top face, side face, and bottom face thereof. The radiative plate 15 is provided with solder layer 16 on its bottom face at a portion below bottom face of the molded resin body 12 so that the solder layer 16 can make the radiative plate 15 connect to cooling pad (conductive layer) on mounting board such as printed circuit board etc. by soldering. Accordingly, by making the radiative plate 15 adhere to the molded resin body 12 by adhesion etc., the radiative plate 15 absorbs the heat generated at resistive plate 11 (especially at portion where the resistive plate works as resistance body), and transfer the heat efficiently into cooling pad (cooling body) on mounting board. Thus, temperature rise can be suppressed, and power capacity of the resistor device can be increased. Especially, the heat generated by resistive plate 11 by applied current is largest at upper side of central portion in the resistor device, since the radiative plate 15 is disposed to surround this portion, then the heat generated at the resistive plate (especially at the portion where the resistive plate works as resistance body) 11 can be removed efficiently.

Figure 1C:
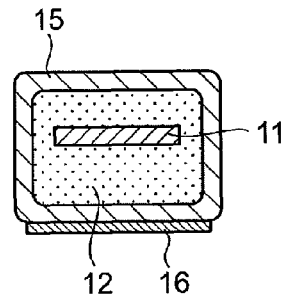
FIG. 1C and FIG. 1D are respectively cross-sectional views along CC line in FIG. 1B.
Figure 1B:
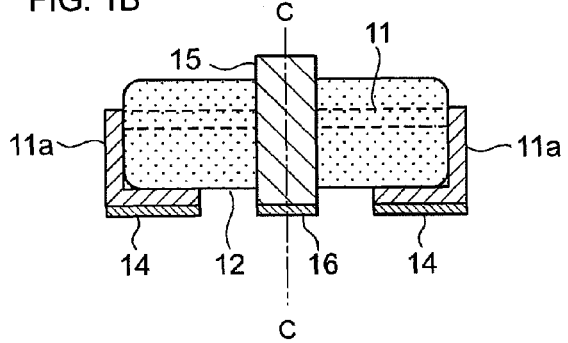
FIG. 1B is its side view.
Figure 1D:
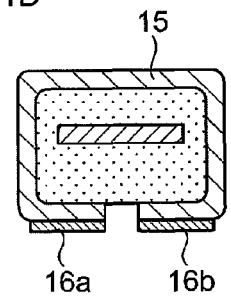

Further, in an example shown in FIG. 1C, the radiative plate 15 goes completely around outer faces of longitudinal central portion of the molded resin body 12. However, as shown in FIG. 1D, the radiative plate 15 may be spaced at bottom face of the molded resin body 12, so that solder layers 16a,16b are separated. Further, a portion, where the radiative plate 15 is spaced, is not limited at bottom face, but it may be disposed at any outer face depending on convenience of design or production in a limit that does not decrease the heat dissipation effect. However, it is preferable to be spaced at the bottom face of the molded resin body 12.

For making the radiative plate 15 go completely around outer faces of the molded resin body 12, there are methods of adhering Cu film tape with adhesive, forming a strip-shaped Cu plate to the molded resin body 12 and adhering it with adhesive, and fitting pre-machined Cu film in the shape of a ring etc. Further, solder layer may not be formed partially as shown in the drawings, but may be formed on all over the faces, which are exposed from the molded resin body 12, that is, all over the faces of terminal portions 11a, 15a of the resistive plate 11 and the radiative plate 15.

Figure 2:
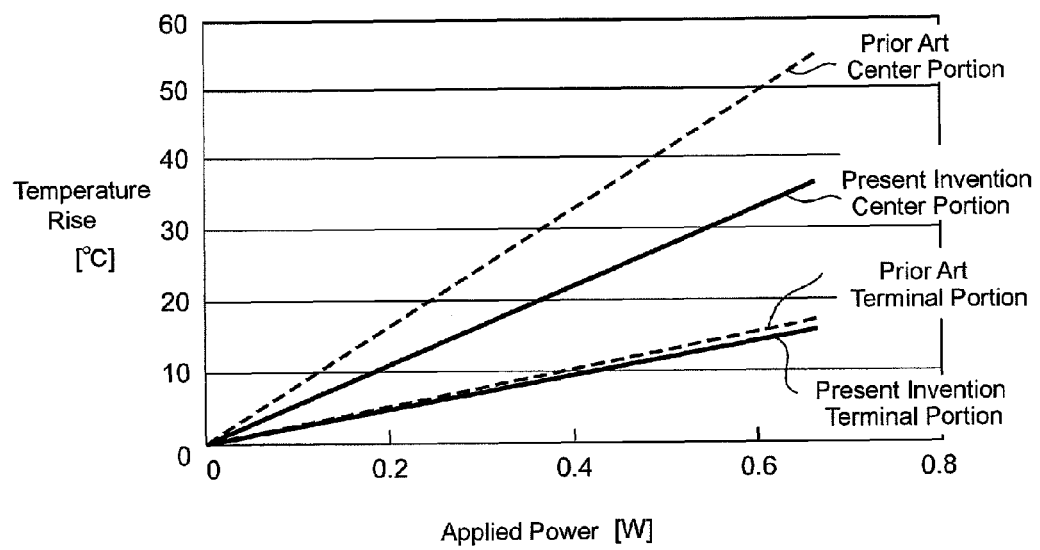
FIG. 2 is a graph showing examples of actually measured temperature rise data of the resistor device.

FIG. 2 shows temperature rise data, which are actually measured by the resistor device with surrounded Cu film around the molded resin body 12. In this example, highest temperature rise portion at central portion of top face of the resistor device and lowest temperature rise portion at terminal portions of the resistor device are measured. According to the resistor device of the present invention, temperature rise at central portion of surface of the resistor device can be suppressed to approximately half comparing to prior art examples by applying same electric power. Since power rating of the resistor device is almost determined by temperature rise, then the power rating of the resistor device can be increased to at least twice according to the present invention.

Figure 3:
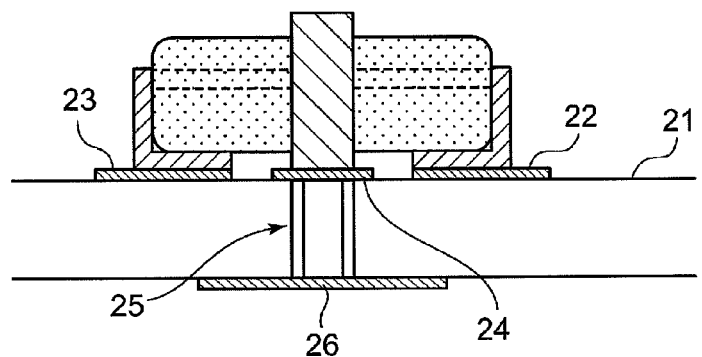
FIG. 3 is a cross-sectional view showing mounting state of the resistor device.

FIG. 3 shows an example of the resistor device of the present invention, which is mounted on a printed circuit board. Printed circuit board 21, on which the resistor device is mounted, is provided with a pad 24 for cooling other than pads 22,23 for electrodes of the resistor device. The pad 24 for cooling is connected to large ground or power-supply conductive layer 26, which is provided at back face of printed circuit board 21 through a thermal via 25. Accordingly, by fixing terminal portion 11a of the resistor device 11 to pads 22,23 for electrodes by soldering and fixing radiative plate 15 via solder layer 16 to pad 24 for cooling by soldering, the heat of radiative plate 15 can be transferred to large ground or power-supply conductive layer 26 through thermal via 25, and the resistor device can be strongly fixed to printed circuit board 21. Further, a cooling body such as large ground or power-supply conductive layer may be provided inside of the board, on which the resistor device is mounted. Further, an example that radiative plate 15 is fixed to pad 24 for cooling by soldering has been explained, however, it may be fixed by adhering with conductive or insulative adhesive, which has good thermal conductivity. Also, the pad 24 for cooling may be formed by insulative material, which has good thermal conductivity.

Figure 4A:
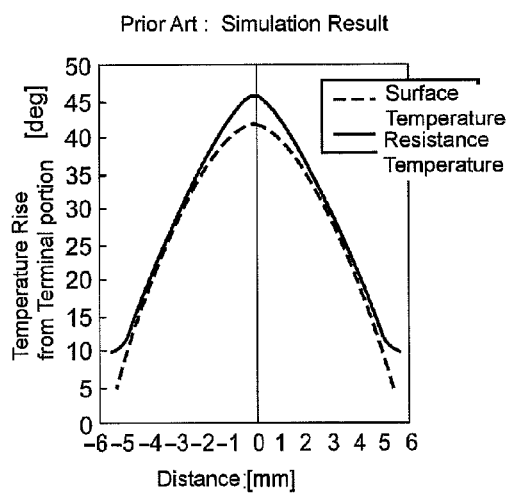
FIG. 4A is a top view of the resistor device and a graph showing temperature distribution by simulation result according to prior art resistor device.
Figure 4B:
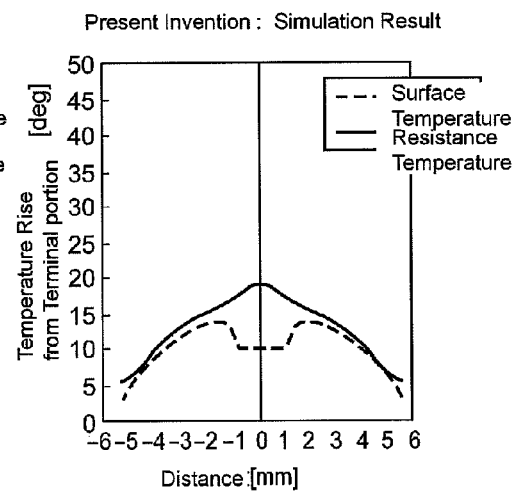
FIG. 4B is a top view of the resistor device and a graph showing temperature distribution by simulation result according to the resistor device of the present invention.
Figure 4B:
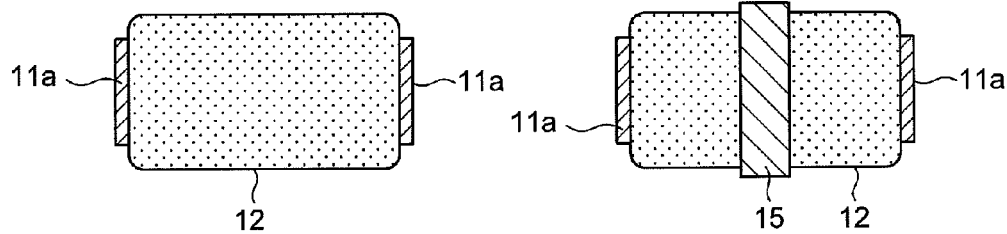

FIG. 4A and FIG. 4B show simulation results for temperature distribution regarding the resistor device of prior art technology, which does not have the radiative plate (shown in FIG. 4A at lower side), and the resistor device of the present invention, which has Cu film surrounded around the molded resin body (shown in FIG. 4B at lower side). As shown in FIG. 4A, as to the resistor device of prior art technology, surface temperature of the molded resin body and temperature of the resistance body become seriously raised by applied current. In contrast, as shown in FIG. 4B, it is understood that according to the resistor device of the present invention, surface temperature of the molded resin body and temperature of the resistance body itself by same applied current become largely fallen. Difference of simulation model between prior art and present invention is whether there is the radiative plate 15 or not. The simulation model assumes that the resistor device is mounted on printed circuit board 21 (see FIG. 3), which is provided with the thermal via 25. Thus, by providing with the radiative plate, the power rating of the resistor device of approximately same size can be increased to double. Also, since temperature rise by self heat generation of the resistance body itself falls largely, resistance variation depending on TCR of the resistance body, when current is applied, becomes fallen largely, then resistance variation can be small when current is applied.

Also, since the resistor device can be strongly fixed to printed circuit board, the bondability of the resistor device to printed circuit board can be improved. That is, in addition to both terminals of the resistor device, central portion of the resistor device is fixed to printed circuit board by the terminal portion of the radiative plate. Then, outbreak of crack at solder joint by difference of thermal expansion coefficient between resistor device and printed circuit board mounting the device can be prevented, and problem to lose stability of resistance value can be avoided. Further, joining strength against vibration can be raised.

Figure 5A:
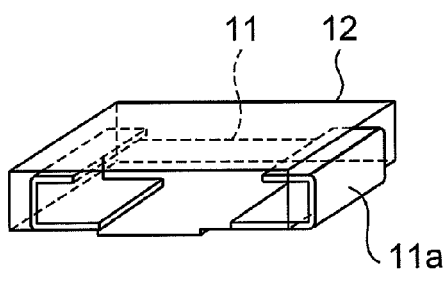
FIG. 5A is a perspective view showing an example of current detecting resistor, which uses a resistive plate of metal plate material.

An example of metal plate resistor device for current detection use, which uses one piece resistive plate 11 as resistance body and its terminal portions, has been explained. However, as shown in FIG. 5A, terminal portions may be formed by disposing resistive plate 11 (resistance body) made of resistance alloy at inside of molded resin body 12, connecting metal plates for terminals made of such as Cu plate etc. 11a at both ends of resistive plate 11 at inside of molded resin body 12, extending the metal plate for terminals 11a from end faces of molded resin body 12, and bending the metal plates for terminals 11a along molded resin body 12 to bottom face thereof. In this structure of the resistor device, by being provided with radiative plate 15, which surrounds circumferences of molded resin body 12 around resistance body as shown in FIGS. 1A-1D, same cooling effect can be efficiently obtained.

Figure 5B:
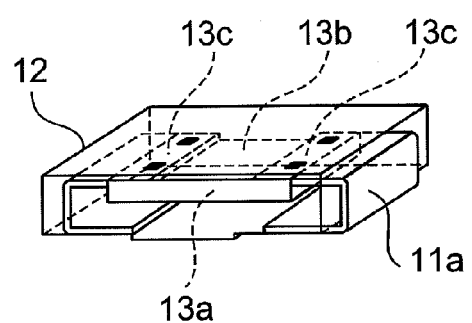
FIG. 5B is a perspective view showing an example of current detecting resistor, which uses a thick film resistance body.

Also, as to metal plate resistor device for current detection use, which uses thick film resistance body sealed by resin as shown in FIG. 5B, the radiative plate 15 can be applied similarly, and cooling effect and bondability to mounting board can be obtained similarly. A resistor device for current detection use, which uses thick film resistance body sealed by resin, is formed by printing thick film paste for resistor on a ceramics substrate 13a to form a thick film resistance body 13b, and fixing metal plates for terminals 11a to electrode portions 13c at both ends of the resistance body. The metal plates for terminal 11a is fixed by welding etc. The metal plates for terminal 11a extending from molded resin body 12 are bent along end face and bottom face of the molded resin body 12. This structure, which uses thick film resistance body, is suitable for current detection at higher resistance region comparing to the metal plate resistor.

FIGS. 6A-6D show a resistor device of second embodiment of the present invention. The resistor device of second embodiment is characterized in that a portion of radiative plate 15 is enclosed at inside of molded resin body 12,12a. That is, the radiative plate 15 is entered into inside of the molded resin body and disposed to intercross on the resistive plate 11 at its upper position, which is slightly spaced from the resistive plate 11 so that parallel flat plates is formed. It is the same as first embodiment of the present invention to have resistive plate 11, rectangular shaped molded resin body 12, which surrounds its circumference, and terminal portions of resistive plate 11a extending from end face of the molded resin body 12 and bent along end face and bottom face of the molded resin body 12.

The radiative plate 15 is disposed in a direction that intercross on a line direction, which links both ends 11a of the resistor device, namely, longitudinal direction of the resistor device. Here, a portion of the radiative plate 15, which is enclosed at inside of the molded resin body 12,12a, is provided with a wide portion 15e, which is wider than terminal portion, and extending along longitudinal direction of the resistance body 11. Further, the radiative plate 15 has its terminal portions 15a extending from a portion of side face between molded resin body 12 and 12a, and bent along side face and bottom face of the molded resin body 12, and provided with solder layers at bottom face.

Figure 6A:
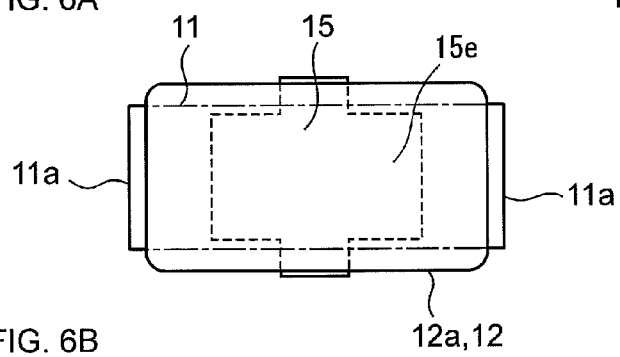
FIG. 6A is an upper view showing a resistor device according to second embodiment of the present invention.
Figure 6D:
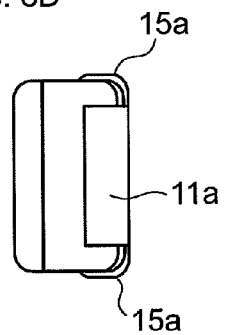
FIG. 6D is its end face view.
Figure 6B:
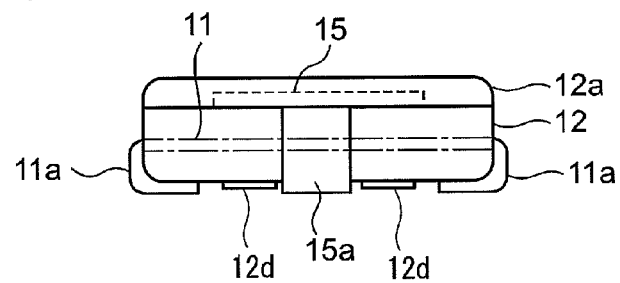
FIG. 6B is its side view.
Figure 6C:
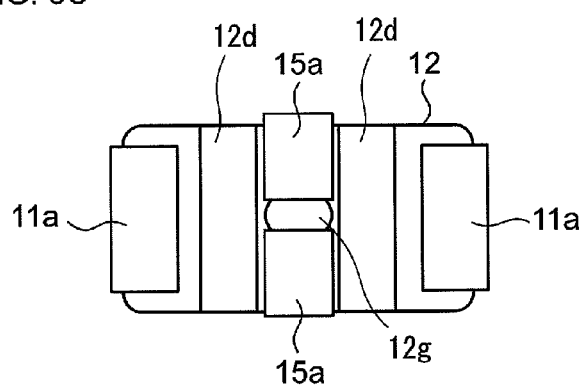
FIG. 6C is its bottom view.

As shown in bottom view of FIG. 6C, at bottom face of the resistor device, terminal portion 11a of resistive plate 11 is disposed at both ends of the resistor device, terminal portion 15a of radiative plate 15 is disposed at central portion of the resistor device, and solder layers are provided on these surfaces. Then the resistor device is surface-mountable on mounting board as shown in FIG. 3. It is stated above that terminal portion 15a of radiative plate 15 at central portion of the resistor device is fixed to cooling pad 24, which is provided on a mounting board (see FIG. 3) by soldering, then excellent heat dissipation characteristics and excellent bondability can be obtained. On bottom face of molded resin body 12, a convex portion 12d is established between terminal portion 11a of resistive plate and terminal portion 15a of radiative plate and a concave portion 12g is established between a pair of terminal portions 15a and 15a. The convex portion 12d is a wall partitioning of terminal portion 11a and terminal portion 15a and suppresses that both terminal portions are conducting on the occasion of solder joining when mounting. The concave portion 12g can absorb surplus solder on the occasion of solder joining when mounting.

Further, an example of the resistor device of second embodiment, which uses a resistive plate, has been explained. However, resin-sealed current-detecting resistor device, which comprises a resistive plate and metal terminal plates connected at both ends of the resistive plate shown in FIG. 5A, and another resin-sealed current-detecting resistor device, which comprises a thick film resistor shown in FIG. 5B, are also possible to adopt the buried radiative plate structure in molded resin body shown in FIGS. 6A-6D.

Figure 7A:
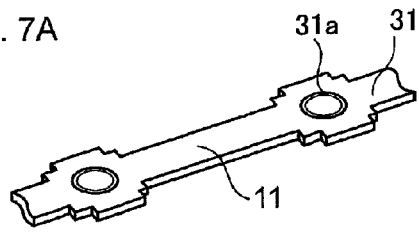
FIGS. 7A-7G are respectively perspective views showing manufacturing steps of the resistor device.

Next, manufacturing method of the resistor device will be explained referring to FIGS. 7A-7G. At first, as shown in FIG. 7A, a resistive plate of resistance alloy such as Cu—Ni alloy etc. is machined by press etc. to prepare strip-shaped metal resistive plate 31, which includes resistive plate 11 and has the shape shown in the view. Strip-shaped plate 31 is provided with forwarding hole 31a for forward processing by automatic machine, and the structure is suitable for automatic processing.

Figure 7B:
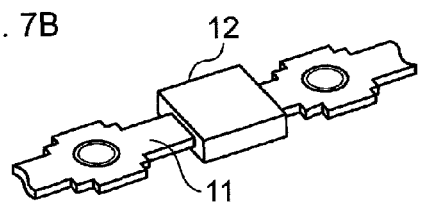
Figure 7C:
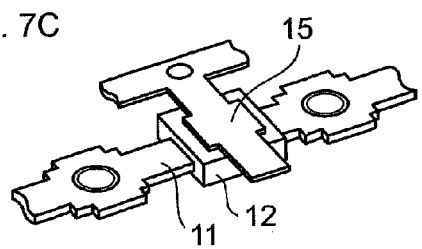

Next, as shown in FIG. 7B, a molded resin body 12 is formed by first molding to surround the resistive plate 11 (especially, a portion, which works as resistance body). Next, as shown in FIG. 7C, a metal plate having good thermal conductivity such as Cu etc. is machined by pressing, etching, etc. to prepare strip-shaped metal plate including radiative plate 15. Then, radiative plate 15 is disposed on molded resin body 12 so as to intercross on the resistive plate 11. That is, the radiative plate 15 is provided with a wide portion 15e, which is wider than terminal portion, and the wide portion 15e is disposed on top face of first molded resin body 12.

Figure 7D:
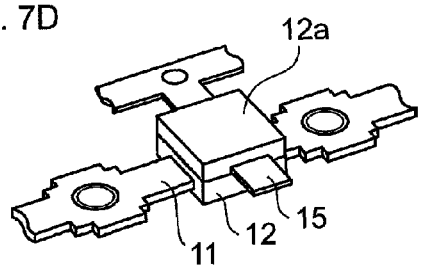

Next, as shown in FIG. 7D, additional molded resin body 12a is formed by second molding to cover radiative plate 15.

Figure 7E:
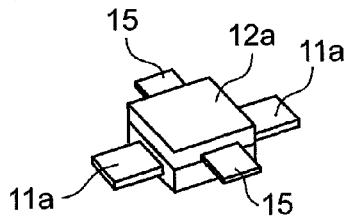
Figure 7F:
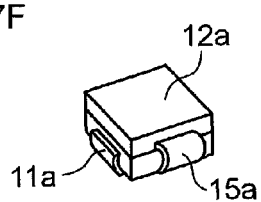
Figure 7G:
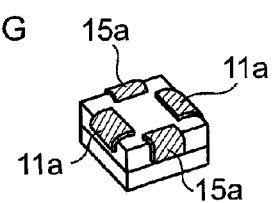

Then, as shown in FIG. 7E, terminal cutting is carried out as to resistive plate 11 and radiative plate 15 respectively. Then, as shown in FIG. 7F, bending (forming) process is carried out as to terminals extending from molded resin body 12,12a, to form terminals 11a of resistive plate and terminals 15a of radiative plate. Further, as shown in FIG. 7G, plating process is carried out if necessary to finish the metal plate resistor device, which is provided with radiative plate 15 surrounding around resistive plate 11 and surface-mountable terminals 11a,15a. Further, FIG. 7G is a perspective view, in which contrary to FIG. 7F, bottom face side of the metal plate resistor device is reversed to upper side.

According to above process, at inside of molded resin body 12,12a, resistive plate 11 and wide portion 15e of radiative plate 15 are disposed in parallel and intercrossing with each other such that they are spaced by slight distance without coming into contact through resin layer. Since radiative plate 15 is extending from side face of molded resin body and bent along side face and bottom face of the molded resin body, then surface-mountable terminals 15a are formed. Especially, since terminal-cutting for the resistive plate and the radiative plate can be carried out similarly, and also terminal-bending for the resistive plate and the radiative plate can be carried out similarly, the resistor device can be manufactured by adding slight process such as second molding etc. to normal manufacturing process thereof. Then, while suppressing increase of cost and size, power capacity can be increased largely and bondability of the resistor device to the mounting board can be improved. Further, there is no radiative plate on top face of the molded resin body different from first embodiment, the top face can be available for marking etc.

Next, a resistor device of third embodiment of the present invention will be described with referring to FIGS. 8A-8G. The resistor device is relating to various kinds of resistor devices including circle stick type leaded resistors such as metal film resistors, metal oxide film resistors, wire wound resistors, metal glaze resistors, and ceramic resistors. The resistor device is formed by sealing these resistors into rectangular-shaped molded resin body, disposing a portion of radiative plate above resistance body inside of molded resin body, and disposing terminal portions of radiative plate and resistive plate so that they are bent along side face, end face, and bottom face of the molded resin body so as to be surface-mountable.

Figure 8A:
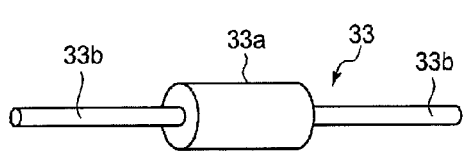
FIGS. 8A-8G are respectively perspective views showing manufacturing steps of the resistor device according to third embodiment of the present invention.
Figure 8B:
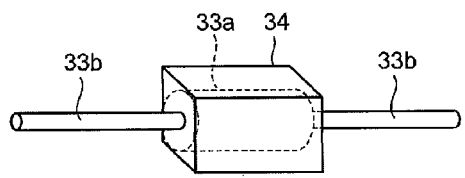
Figure 8C:
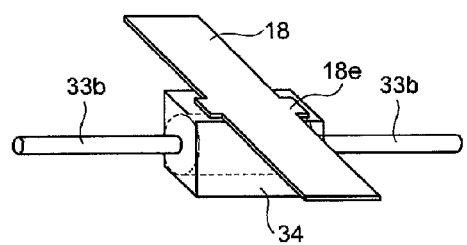
Figure 8D:
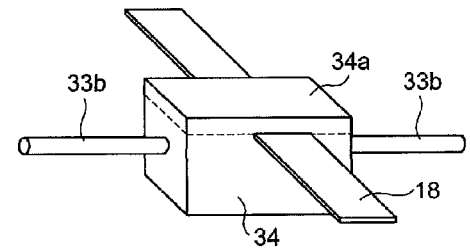

An example of manufacturing process is, at first, as shown in FIG. 8A, to prepare a circle stick type leaded resistor 33, which is provided with main body of resistor 33a and lead terminal 33b. Next step is, as shown in FIG. 8B, to carry out first molding so as to form rectangular-shaped molded resin body 34 for surrounding circumferences of resistor main body 33a. Next step is, as shown in FIG. 8C, to dispose radiative plate 18 on top face of molded resin body 34 so that a wide portion 18e covers upper portion of resistor main body 33a. The radiative plate 18 is made from metal plate having good thermal conductivity such as Cu etc. by etching or press machining etc. Next, as shown in FIG. 8D, to carry out second molding so as to form additional molded resin body 34a on molded resin body 34 and to seal a portion of radiative plate 18. Accordingly, inside of molded resin body, radiative plate 18 does not come into contact with resistor main body 34a with each other, and radiative plate 18, which is disposed to intercross on the resistor main body 34a, is buried inside of molded resin body 34,34a.

Figure 8E:
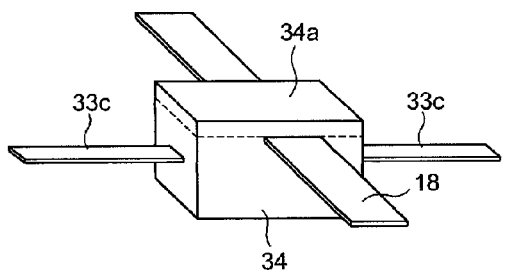
Figure 8F:
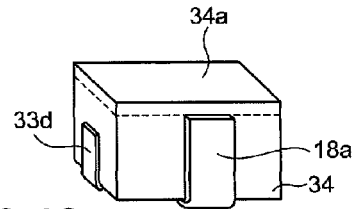

Next, as shown in FIG. 8E, to smash lead terminal 33b by press machining to form flat lead terminal 33c. Also, it may be well to prepare flat lead terminal 33C, which comprises flat metal plate for terminal use, and to connect this to lead terminal of circle stick shaped at inside of the molded resin body. Next, as shown in FIG. 8F, to bend each of terminals along side or end face and bottom face of molded resin body 34. That is, the radiative plate 18 extends from side face of molded resin body, and is bent along side and bottom faces of molded resin body, and thus, terminal portion 18a has been formed. Also, the lead terminal 33c extends from end face of molded resin body, and is bent along end and bottom faces of molded resin body, and thus, terminal portion 33d has been formed.

Figure 8G:
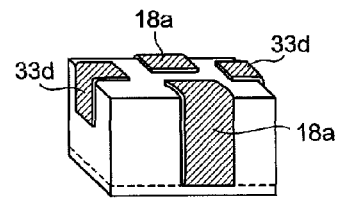

Next, as shown in FIG. 8G, to perform terminal plating including solder plating, and then the surface-mountable resin-sealed resistor device is completed. In addition, the figure is that mounting face (bottom face) of resistor device is displayed as top face, terminal portions 18a may extend to neighborhood of bottom face center, or may be connected each other.

By this structure, for example, even though a circle stick type resistor can be resin-sealed, and can be surface-mountable, and by the radiative plate, which surrounds circumferences of the resistance body, power capacity enables to be improved and bondability to mounting board enables to be improved.

In addition, as another embodiment, it is possible to bend the radiative plate, which extends from side face of molded resin body, upwardly and to dissipate the heat in atmosphere.

Figure 9A:
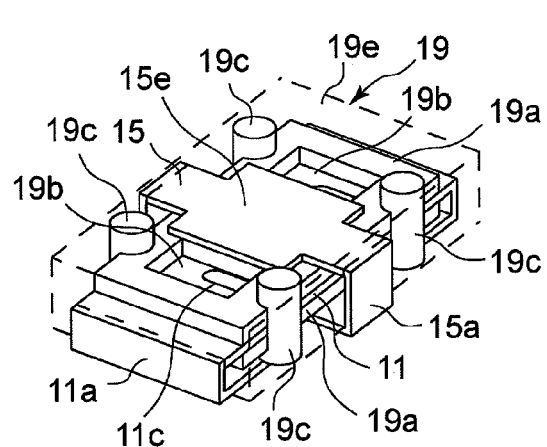
FIG. 9A is a perspective view, which see through inside of the molded resin body, showing mainly upper side of the resistor device according to fourth embodiment of the present invention.
Figure 9B:
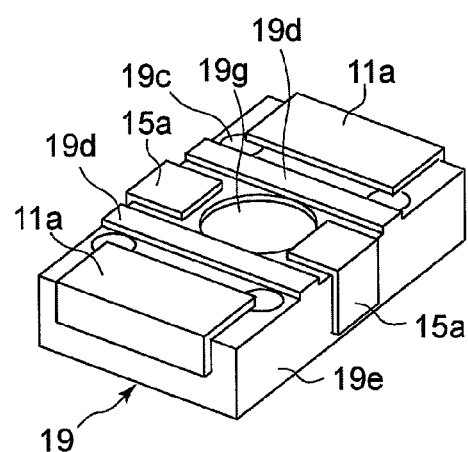
FIG. 9B is a perspective view showing its bottom side as upper side.

FIGS. 9A-9B show a resistor device according to fourth embodiment of the present invention. FIG. 9A is a perspective view, which shows seeing through inside of the molded resin body, in which top face of the resistor device of fourth embodiment is shown as top. FIG. 9B is a perspective view, which shows the resistor device of fourth embodiment, in which bottom face (mounting face) of the resistor device is shown as top. As to the resistor device, basic construction is same with the resistor device according to second embodiment above explained, however construction of the molded resin body 19 is different. The molded resin body 19 according to fourth embodiment encloses intercrossing portion of resistance body 11 and radiative plate 15, and the molded resin body 19 is comprised by first molded resin body 19a and second molded resin body 19e (shown by dotted line in FIG. 9A), which surrounds around first molded resin body 19a. The first molded resin body 19a is provided with columnar projections 19c, which are projecting upper and lower, and opening portions 19b, where the resistance body is exposed.

As shown in FIG. 9A, the first molded resin body 19a is formed around a portion of resistive plate 11, which comprises metal plate, that is, the first molded resin body 19a is formed on upper and lower faces of a portion of resistive plate, which works as resistance body, except opening portions 19b. The first molded resin body 19a is provided with columnar projections 19c extending upper and lower at four places at circumferences thereof. The side faces of resistive plate 11 is exposed, however upper and lower portions than resistive plate 11 portions of the first molded resin body 19a is connecting and uniting by the projections 19c. From opening portions 19b, the resistive plate 11 is exposed, and slit 19c formed in the resistive plate 11 is also exposed. In addition, resin material of the first molded resin body 19a is filled in slit 11c. The opening portions 19b are also formed at bottom side of resistive body 11. A portion of radiative plate 15 of metal plate, which is provided with a wide portion 15e, is disposed on top face of first molded resin body 19a, and the first molded resin body 19a and the radiative plate 15 are sealed in second molded resin body 19e, and a rectangular solid shaped molded resin body 19 is formed. Both ends of the resistive plate 11 extend from end faces of second molded resin body

19e, and both ends of the radiative plate 15 extend from side faces of second molded resin body 19e. Each of both ends of the resistive plate 11 and the radiative plate 15 is bent along outer shape of the second molded resin body 19e to bottom face thereof, and terminal portions of the resistance body 11a and terminal portions of the radiative plate 15a are formed.

It is preferable to form the first molded resin body 19a and the second molded resin body 20a of homogeneous resin material. By this, the first molded resin body 19a and the second molded resin body 20a enables to be formed as an integral molded resin body. The first molded resin body 19a, which is provided with projections 19c and openings 19b, has large surface area and large joining area that can join to second molded resin body 19e. Then, it can make combination with first molded resin body 19a and second molded resin body 19e strong. According to fourth embodiment, top and bottom faces of the projections 19c are exposed from second molded resin body 19e, however other than this, all faces of first molded resin body 19a are covered by second molded resin body 19e. Height of the projection 19c is equivalent to thickness of the second molded resin body 19e, which is formed so as to cover surfaces of the first molded resin body 19a. Further, height of the projection 19c is lower at mounting face side (a side without radiative plate) and is higher than it at top face side (a side with radiative plate). By this, since the portion of resistive plate, which works substantially as resistance body, is disposed close to mounting face side, heat dissipation characteristics enables to be improved, and the other hand, the top face side enables to secure thickness for disposing the radiative plate. In addition, even if the second molded resin body 19e does not cover up the whole circumference of first molded resin body 19a, for example, the second molded resin body 19e cover radiative plate 15 on top face and side faces of first molded resin body 19a, and it may not extend to cover bottom face of first molded resin body 19a.

As an example, the size of a resistor device is 11 mm (length)×7 mm (width)×2.5 mm (height), the width of the resistive plate 11 is around 5 mm, the thickness is around 0.2 mm, the width of radiative plate 15 is around 3 mm at terminal portion, and around 5 mm at wide portion, and the thickness is around 0.2 mm. Thickness of the first molded resin body is around 0.5 mm, and wide portion 15e of radiative plate 15 is disposed above central portion of resistive plate 11 (that is, a portion for working as resistance body) such as parallel flat plates with spaced distance of 0.5 mm. By this, the heat generated by the resistive plate 11 can be efficiently absorbed, and can be efficiently dissipated to mounting board side through terminal portions 15a.

FIG. 9B is a perspective view, which shows the resistor device according to fourth embodiment, in which bottom face (mounting face) of the resistor device is shown as top. Terminal portions 11a, 15a are bent along end faces and bottom face of the molded resin body. A convex portion 19d is provided at between terminal portions of the resistive plate 11 and terminal portions of the radiative plate 15. Since terminal portions 15a,15a are disposed between terminal portions 11a and 11a, depending on mounting patterns or amount of solders, there is a threat that terminal portion 11a and terminal portion 15a may conduct each other. The convex portion 19d becomes a wall partitioning terminal portion 11a and terminal portion 15a, and suppresses that both terminals become conducted. In addition, between a couple of terminal portions of the radiative plate 15a and 15a, a concave portion 19g is formed so that excess solder enables to flow into.

In addition, as a resistor device of fourth embodiment of the present invention, an example of the resistor device, which uses resistive plate of metal plate material, has been explained. However, as to a resin-sealed current detecting resistor shown in FIG. 5A, which uses metal resistive plate and metal terminal plate connected at both ends of the resistive plate, and as to a resin-sealed current detecting resistor shown in FIG. 5B, which uses thick film resistance body, an application of the molded resin body 19 of the present embodiment can be possible in the same way.

Next, method of manufacturing the resistor device will be described with referring to FIGS. 10A-10G and FIGS. 11A-11G. In the actual manufacturing method, the resistive plate 11 and the radiative plate 15 are fabricated from long hoop material, and a plural of devices is molded at the same time in molding process etc. However for purpose of explanation, only a part equivalent to one piece of the resistor device will be shown in the drawings.

Figure 10A:
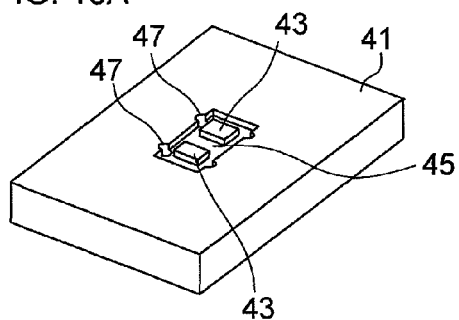
FIGS. 10A-10E are respectively perspective views showing front half of manufacturing steps of the resistor device according to fourth embodiment of the present invention.
Figure 10B:
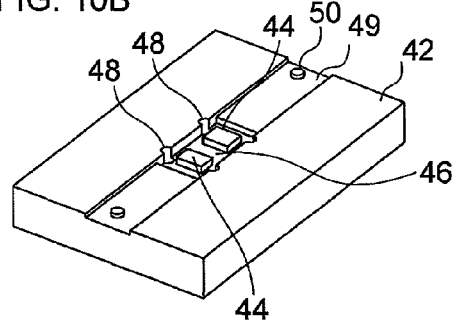

At first, upper mold die 41 for first molding shown in FIG. 10A and lower mold die 42 for first molding are prepared. These mold dies are provided with convex portions 43,44 for abutting to and sandwiching the resistive plate 11, and concave portions 45,46 for forming the first molded resin body 19a. In concave portions 45,46, there is provided concave portions 47,48, which are semi-circular at upper portion and circular at lower portion for forming columnar projections 19c. In addition, a groove 49 for inserting the resistive plate 11 and a convex portion 50 for fitting to transfer hole 31a of the resistive plate 11 are formed in the lower mold die 42.

Figure 10C:
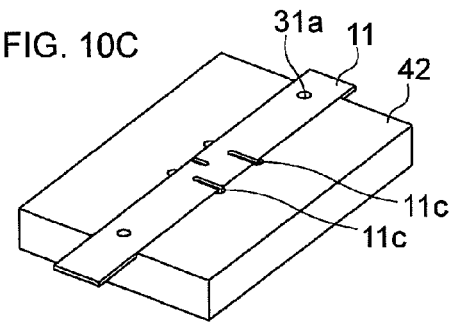
Figure 10D:
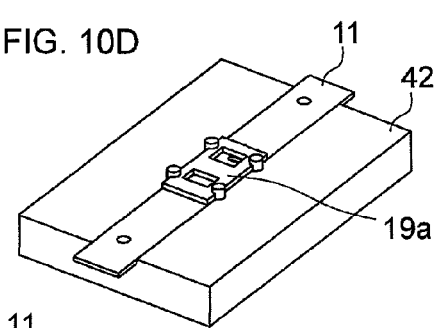

Next, as shown in FIG. 10C, the resistive plate 11 is set at groove 49 in lower mold die 42 and transfer hole 31a of the resistive plate is fit to convex portion 50 for positioning. Then, the lower mold die 42 is covered with upper mold die 41 and resin is injected. At this time, the outskirt of slit 11c of the resistive plate for forming serpentine current path is sandwiched and fixed by convex portions 43, 44 of upper mold die 41 and lower mold die 42. The resistive plate 11 is thin, and the outskirt of slit 11c of the resistive plate is easy to be deformed by pressure of resin injection. However, since the resistive plate 11 is sandwiched and fixed by convex portions 43,44, deformation of the resistive plate 11 can be prevented and the first molded resin body 19a can be formed, in which the resistive plate 11 is sealed at pre-determined position. FIG. 10D shows that first molded resin body 19a has been formed and upper mold die 41 has been removed.

Figure 10E:
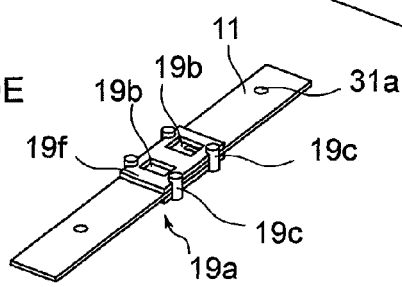
Figure 10F:
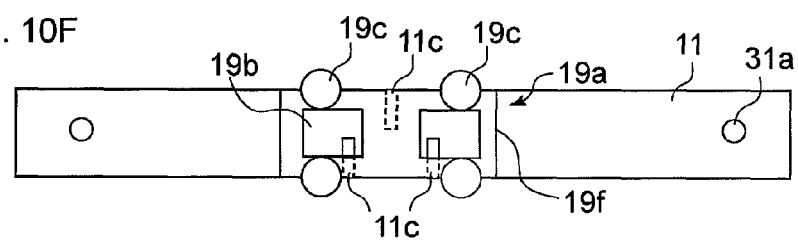
FIG. 10F is a top view of FIG. 10E.
Figure 10G:
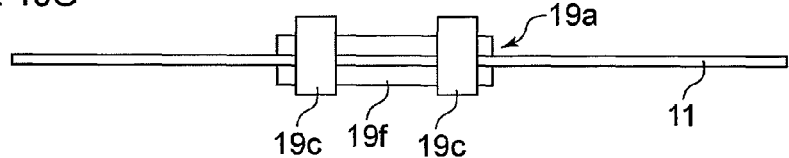
FIG. 10G is a side view of FIG. 10E.

FIG. 10E is a perspective view, which shows a step that first molded resin body 19a has been formed to the resistive plate 11, FIG. 10F is its plan view, and FIG. 10G is its side view. The resistive plate 11 is long strip-shaped material, which comprises resistive alloy such as Cu—Ni alloy etc., and provided with transfer hole 31a. By this, mass production is possible by using automatic production line. The first molded resin body 19a is provided with openings 19b, which is formed by sandwiching and fixing with convex portions 43,44 of upper mold die 41 and lower mold die 42, and the resistive plate 11 is exposed in the openings 19. In FIG. 10F, the slit 11c is shown by solid line at a portion where the slit is exposed at the openings, and by dotted line at a portion where the slit is covered by first molded resin body 19a. The openings 19a is formed at outskirt of the slit 11c, that is, it shows that the outskirt of the slit 11c has been sandwiched and fixed with convex portions 43,44 of upper mold die 41 and lower mold die 42.

In addition, the first molded resin body 19a is formed in the shape of a frame to surround a portion of resistive plate 11, especially, a portion where slit 11c is formed for working as a resistance body. This is for preventing resistance body 11 to be deformed at the second molding. Columnar projection 19c is formed as a portion of first molded resin body 19a by concave portions 47,48, which is semi-circular at upper portion and circular at lower portion, formed in upper mold die 41 and lower mold die 42. Columnar projection 19c comprises a columnar portion, which extends upwardly and downwardly from box portion 19f of first molded resin body 19a, and a half-cut columnar portion, which is disposed at a side face of the box portion 19f.

Figure 11A:
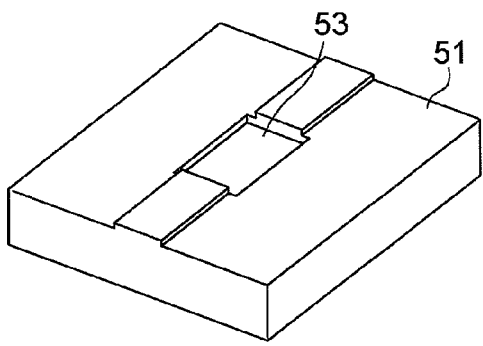
FIGS. 11A-11D and FIGS. 11F-11G are respectively perspective views showing back half of manufacturing steps of the resistor device according to fourth embodiment of the present invention.
Figure 11B:
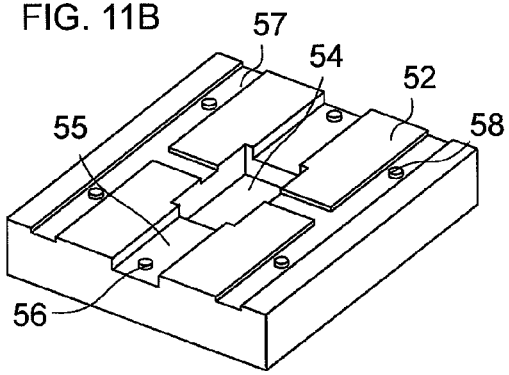

Next, to prepare upper mold die 51 for second molding shown in FIG. 11A and lower mold die 52 for second molding shown in FIG. 11B. In upper mold die 51 and lower mold die 52, concave portions 53,54 are formed for forming second molded resin body 19e respectively. Lower mold die 52 is provided with groove 55 for setting strip shaped resistive plate 11 therein, and convex portion 56 for fitting in with transfer hole 31a of resistive plate 11, in addition, groove 57 for setting lead frame of radiative plate material, and convex portion 58 for fitting in with a transfer hole of the lead frame.

Figure 11C:
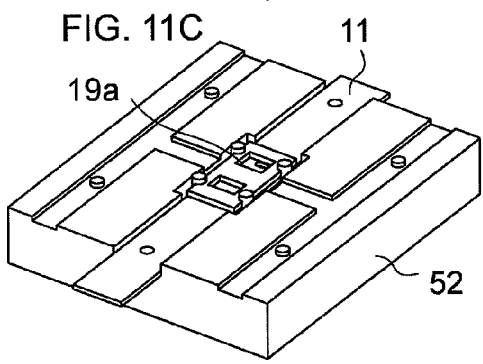
Figure 11D:
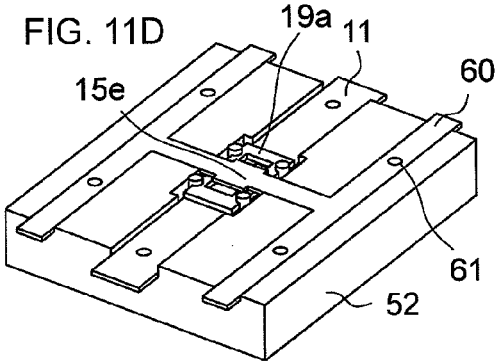

Then, as shown in FIG. 11C, resistive plate 11, on which first molded resin body 19a is formed, is set in groove 55, transfer hole 31a of resistive plate 11 is fitted in with convex portion 56 for positioning the resistive plate 11. Further, as shown in FIG. 11D, radiative plate material (lead frame) of copper plate 60 is set in groove 57, transfer hole 61 of lead frame is fitted in with convex portion 58 for positioning the lead frame. Wide portion 15e of the radiative plate is positioned above a portion of resistance body 11, where slit 11 is formed, so that the wide portion 15e is spaced from resistance body 11. In addition, for stabilizing heat dissipation characteristics, first molded resin body 19a is filled between the radiative plate 15 and the resistance body, that is, between a portion, where resistive plate 11 and radiative plate 15 are intercrossing. Further, radiative plate 15, especially wide portion 15e is disposed between projections 19c and 19c for stabilizing the positioning. Then upper mold die 51 covers, and resin is injected to carry out second molding.

Figure 11E:
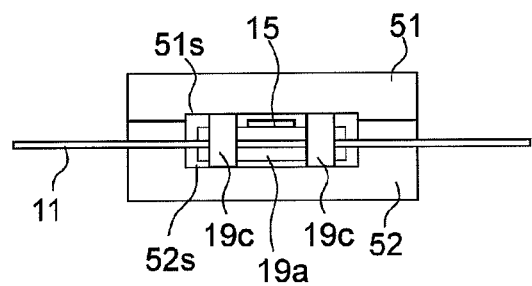
FIG. 11E is a cross sectional view showing inside of a mold die.

At this time, as shown in FIG. 11E, top end of projection 19c formed on first molded resin body 19a abuts to upper face (bottom face) 51s in concave portion 53 of upper mold die 51, and a bottom end of projection 19c abuts to lower face (bottom face) 52s in concave portion 54 of lower mold die 52. By this, position of first molded resin body 19a is fixed at inside of upper and lower mold dies 51,52, and even if pressure of resin injection is applied, shift of position or deformation of first molded resin body 19a can be suppressed. And, structural unevenness of resistive plate 11 and radiative plate 15 inside of molded resin body 19 can be decreased.

Figure 11F:
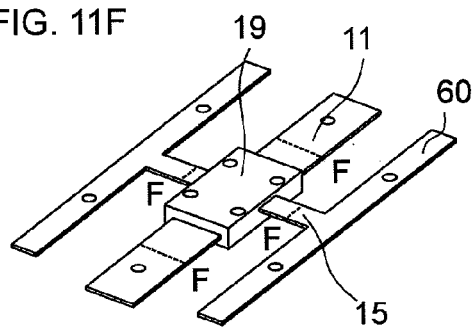
Figure 11G:
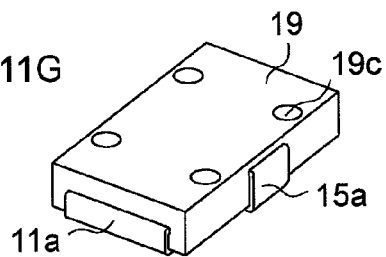

FIG. 11F shows a situation that molded resin body 19 is picked up after second molding has been completed and mold dies 51,52 have been removed. By second molded resin body 19e, the radiative plate is fixed to first molded resin body 19a. As shown in the drawing, resistive plate 11 and radiative plate 15 extend from side (end) faces of molded resin body 19, and these are lead cut along cutting line F. Then, by bending along side (end) faces and bottom face of molded resin body 19, and by plating, as shown in FIG. 11G, the resistor device of the present embodiment is completed.

By this, a resistor device, in which the resistive plate of metal plate material and the radiative plate of metal plate material are disposed at inside of the molded resin body 19 so that they are intercrossed and spaced each other, and terminal portions of the resistive plate and the radiative plate are respectively bent along end face and bottom face of the molded resin body, can be manufactured economically with good productivity.

Although certain embodiments of the present invention have been shown and described, it should be understood that the present invention is not limited to the above embodiments, and various changes and modifications may be made therein within the scope of the appended claims.

INDUSTRIAL APPLICABILITY

The present invention can be suitably used in a surface-mountable resin-sealed resistor device for current detection. In accordance with enclosing a radiative plate in conventional structure and forming its terminal portions, by slight increase of size, it can make power capacity drastically increased and reliability improved without changing most of the size.

The invention claimed is:

1. A resistor device comprising:
   a resistive plate of metal plate material, which is used as a resistance body;
   a radiative plate of metal plate material, which is spaced from the resistive plate and intercrossed on the resistive plate;
   a molded resin body, which encloses an intercrossing portion of the resistive plate and the radiative plate;
   terminal portions of the resistive plate, which comprises so that both ends of the resistive plate extending from the molded resin body are bent along an end face and a bottom face of the molded resin body; and
   terminal portions of the radiative plate, which comprises so that both ends of the radiative plate extending from the molded resin body are bent along an end face and a bottom face of the molded resin body;
   wherein the molded resin body comprises a first molded resin body, which encloses the resistive plate, and a second molded resin body, which fixes the radiative plate on the first molded resin body; and
   wherein the first molded resin body is provided with projections, which has height equivalent to thickness of the second molded resin body.

2. The resistor device according to claim 1, wherein the second molded resin body covers circumference of the first molded resin body.

3. The resistor device according to claim 1, wherein the projections are formed on upper and lower of the first molded resin body.

4. The resistor device according to claim 1, wherein the radiative plate is disposed between a plural of the projections.

5. The resistor device according to claim 1, wherein the first molded resin body is formed in a shape of a frame so that a portion of the resistive plate is exposed, and exposed portion of the resistive plate is filled with the second molded resin body.

6. The resistor device according to claim 5, wherein at least a portion of slit formed in the resistive plate is exposed at an exposed portion of the resistive plate.

7. The resistor device according to claim 5, wherein the first molded resin body is filled at a space, where the resistive plate and the radiative plate are intercrossing therebetween.

8. The resistor device according to claim 1, wherein a convex portion of the molded resin body is formed between a terminal portion of the resistive plate and a terminal portion of the radiative plate on a face of the molded resin body, which becomes mounting face side of the molded resin body.

9. The resistor device according to claim 1, wherein a concave portion of the molded resin body is formed between a pair of the terminal portions of the radiative plate on a face of the molded resin body, which becomes mounting face side of the molded resin body.

10. The resistor device according to claim 1, wherein a wide portion extending along longitudinal direction of the resistive plate is formed at a portion of the radiative plate buried in the molded resin body.

11. A method for manufacturing a resistor device comprising:

forming a first molded resin body by molding to surround a resistive plate and to make terminal portions of the resistive plate extending therefrom;

disposing a radiative plate on top face of the first molded resin body to intercross on the resistive plate at central portion thereof;

wherein a plural of projections is formed on top face of the first molded resin body, and the projections abut to inner face of a second mold die when the first molded resin body is set into inside of the second mold die;

forming a second molded resin body by molding to cover the radiative plate and to make terminal portions of the radiative plate extending therefrom; and bending the terminal portions of the resistive plate and the terminal portions of the radiative plate along the molded resin body to bottom face thereof.

12. The method according to claim 11, wherein a first mold die for forming the first molded resin body has a shape that a portion of the mold die abuts to the resistive plate.

13. The method according to claim 11, wherein a wide portion which is wider than the terminal portion is formed in the radiative plate, and the wide portion is disposed on top face of the first molded resin body.

* * * * *